(12) United States Patent
Niemiec et al.

(10) Patent No.: US 6,411,567 B1
(45) Date of Patent: Jun. 25, 2002

(54) DRUG DELIVERY MANAGEMENT SYSTEM

(76) Inventors: Mark A. Niemiec, 102 Surrey La., Ponta Vedra Beach, FL (US) 32082; Louis M. Heidelberger, 357 Spring Mill Rd., Villanova, PA (US) 19085; Daniel H. Golub, 1500 Locust St., Apt. 2213, Philadelphia, PA (US) 19102

( * ) Notice: Subject to any disclaimer, the term of this patent is extended or adjusted under 35 U.S.C. 154(b) by 60 days.

(21) Appl. No.: 09/611,582

(22) Filed: Jul. 7, 2000

(51) Int. Cl.$^7$ .................. G04B 47/00; G04B 47/06; B65D 13/04; G07F 11/00; G08B 13/14

(52) U.S. Cl. ..................... 368/10; 368/11; 368/206; 368/531; 368/534; 368/221; 368/2; 368/15; 368/340; 368/868.1

(58) Field of Search .................. 368/10, 11; 340/568.1; 206/531–534; 221/2, 3, 15

(56) References Cited

U.S. PATENT DOCUMENTS

| | | | |
|---|---|---|---|
| 4,617,557 A | * 10/1986 | Gordon | 340/568 |
| 4,749,875 A | 6/1988 | Hara | |
| 5,412,372 A | * 5/1995 | Parkhurst et al. | 340/568 |
| 5,852,590 A | * 12/1998 | de la Huerga | 368/10 |

FOREIGN PATENT DOCUMENTS

WO    WO 98/36727    8/1998

OTHER PUBLICATIONS

Bens Newsletter, (visisted Apr. 17, 2000) <http://www.pack-expo.com/templates/BensNewsletter.cfm>.

Daphne Allen, "Using Bar Codes to Reduce Medical Errors", Pharmaceutical & Medical Packaging News, Bar Code Supplement, 2000, pp., 51–65.

Paul Raeburn, "The Weak Link In The Drug–Safety Chain: Doctors", Business Week, 2000, p. 50.

Annie Lubinsky, "Source Tagging Increases Sales", Pharmaceutical & Medical Packaging News, 2000, pp., 38–45.

"Finally, A Drug Package For The Forgetful", Packaging Strategies, 2000.

* cited by examiner

*Primary Examiner*—Vit Miska
(74) *Attorney, Agent, or Firm*—Reed Smith LLP (57) ABSTRACT

A system for managing delivery of pharmaceutical drugs is formed of a blister package that includes a plurality of cells arranged in a grid. Each of the cells is sealed by a breakable wall and holds a unit-dose of medication. A user gains access to the medication in a given cell by puncturing the breakable wall associated with the given cell. A severable conductor is positioned proximate to each breakable wall. The severable conductor associated with a given cell ruptures upon puncturing of the breakable wall associated with the given cell. A computer chip is electrically connected to the severable conductors. The computer chip senses the puncturing of each cell in the grid by monitoring the rupturing of each of the severable conductors. An RF transmitter is coupled to the computer chip. The RF transmitter sends information corresponding to usage of each of medications stored in the blister package to a remote information transceiver.

17 Claims, 7 Drawing Sheets

DRUG DELIVERY MANAGEMENT SYSTEM

FIELD OF THE INVENTION

The present invention relates generally to systems and methods for tracking usage and preventing errors in the delivery of medical treatments. More particularly, the present invention relates to systems and methods for monitoring the delivery of medications to patients, such as over-the-counter and prescription drugs, as well as to systems and methods for insuring that such medications are administered to patients at prescribed times. Among other benefits, the present invention may save the lives of patients by reducing medical errors. The present invention also may reduce exposure of hospitals and other medical professionals to liability for errors arising from improper delivery of medications.

BACKGROUND OF THE INVENTION

The explosive developments in medical treatment relating to drugs have created a costly and high risk drug management environment for the patient. A 1995 study published in the "Archives of Internal Medicine" estimates that $76 billion is spent each year in the U.S. on extra doctor visits and hospitalization because people do not take their medication properly. In addition, a 1999 study by the National Academy of Science, Institute of Medicine, describes errors made in the hospitals which threaten patient's health. The study estimated that 98,000 patients die each year because of medical mistakes. Prescription drug errors are one of the major areas where mistakes are made.

Unit-dose blister type packaging for prescription drugs is one of the fastest growing package formats and is projected to be at 40% penetration in the U.S. market by 2003. Blister packages are already the dominant prescription drug package format in Europe with 85% penetration. Some of the reasons behind this growing use of blister packaging are: (i) product integrity being maintained throughout out the drug life cycle, (ii) better product protection to insure quality and efficacy of the drug, (iii) better tamper evidencing and child resistance, and (iv) improved patient compliance in that unit-dose blister packaging gives patents a clearly marked individual dosage.

It is an object of the present invention to provide a system that incorporates unit dose blister-type packaging and improves the safety, compliance and cost of prescription drugs and over-the-counter drugs in the hospital and at home.

It is a further object of the present invention to improve the ability of the pharmaceutical industry to acquire information regarding the real world usage of medications.

Further objects and advantages of the invention will be made clear from the description and drawings below.

SUMMARY OF THE INVENTION

The present invention is directed to a medication package and system for assisting in the management of the delivery of medications. The system includes a package that includes one or more unitary-dose cells. Each cell is sealed by a breakable closure. A user gains access to medication in a cell by rupturing the closure associated with the cell. A severable conductor is positioned proximate to each cell. The severable conductor associated with a given cell is cut upon rupture of the closure associated with the given cell, resulting in a loss of continuity through the conductor.

In a first embodiment, the medication package is provided with an attachable circuitry unit to create a medication management system. The unit includes a connector for attaching the medication package to circuitry contained in the unit. The circuitry in the unit allows the accessing of the cell or cells of the package to be monitored. Memory may be included in the unit to allow acquired data to be stored. A processor and clock may be included to allow recording of the time at which a cell or cells was accessed. Alternately, the processor may be used to determine when a cell should be accessed for medication to be taken. A signal such as a buzzer or light may be included to indicate an event to a user, such as when medication should or should not be taken. An RF transceiver may be included for communicating data from the unit and instructions or data to the unit.

In another embodiment, the system of the present invention is a blister package that includes a plurality of cells arranged in a grid. Each of the cells is sealed by a breakable closure and holds a unit-dose of a medication. A user gains access to the medication in a given cell by rupturing the breakable closure associated with the given cell. A severable conductor is positioned proximate to each breakable closure. The severable conductor associated with a given cell is cut when the breakable closure associated with the given cell is ruptured to allow access to the medication therein. A computer chip is affixed to the blister package and electrically connected to the severable conductors. The computer chip senses the accessing of each cell in the package by monitoring for loss of continuity in individual conductors due to cutting of each of the severable conductors. An RF transmitter is affixed to the blister package and coupled to the computer chip. The RF transmitter may send information corresponding to usage of each of the medication stored in the blister package to a remote information transceiver.

In another embodiment, the RF transmitter sends information corresponding to usage of medication stored in one cell in the blister package to the remote information transceiver upon cutting of the severable conductor associated with the one cell.

In addition, the package may include a memory that stores time values, wherein each of the time values represents a time when medication stored in one cell in the blister package is due to be taken by a patient. Upon receipt of the information corresponding to usage of medication stored in one cell in the blister package, the memory stores a further time value representing a time when medication stored in one cell in the blister package was actually taken by the patient. In a particularly preferred embodiment, the remote information transceiver generates an alarm if the time when medication stored in one cell in the blister package is due to be taken by a patient passes before the remote information transceiver receives a signal indicating that medication stored in a cell in the blister package was actually accessed by the patient.

An RF receiver is also preferably affixed to the blister package and coupled to the computer chip. The RF receiver receives information corresponding to an expiration date of each of the medications stored in the blister package, and the computer chip stores such information. The expiration date information may, for example, be transmitted to and stored in the memory at the time of shipment of the blister package from a manufacturer or distributor. At a later time (e.g., at the time the blister pack is dispensed from a pharmacy), the RF transmitter may send the information corresponding to the expiration date to the remote information transceiver. In this embodiment, the remote information transceiver generates a further alarm if the time when medication stored in one cell in the blister package is due to be taken by a patient exceeds the expiration date information associated with the blister package.

In accordance with a further aspect, the remote information transceiver comprises a plurality of local RF sensors each of which is located is an individual hospital room, and a central computer coupled to each of the plurality of local RF sensors. The system also includes a plurality of portable data monitoring units each of which is coupled by a wireless link to the central computer. Each of the portable data monitoring units is associated with a medical professional who is responsible for administering medication to a group of one or more patients. In this embodiment, each alarm generated by the remote information transceiver is associated with a particular patient, and the remote information transceiver sends each such alarm to the portable data monitoring unit associated with the medical professional who is responsible for administering medication to the particular patient.

In accordance with a still further aspect, the package of the present invention further includes a temperature sensor coupled to the computer chip. The temperature sensor sends information corresponding to an ambient temperature proximate the package to the computer chip. An alarm is generated if the ambient temperature sensed by the temperature sensor exceeds a first threshold or is below a second threshold. The first and second thresholds correspond, for example, to the upper and lower temperature limits to which the pharmaceuticals in stored in the package may be exposed without losing efficacy. The alarm may be generated from information stored in the package memory (i.e., the allowable temperature limits), or alternatively, by the remote information transceiver based on similar information stored therein. As a result of the alarm, a patient or a medical professional responsible for administering medication to a patient will be immediately informed that the packaged medication should not be used if the package has been subjected to temperature conditions that are outside acceptable limits.

In accordance with a further aspect, the package of the present invention includes a humidity sensor coupled to the computer chip. (The humidity and temperature sensor may be formed from an integrated unit on the package). The humidity sensor sends information corresponding to humidity proximate the medication cell to the computer chip. An alarm is generated if the ambient humidity sensed by the humidity sensor exceeds a first threshold or is below a second threshold. The first and second thresholds correspond, for example, to the upper and lower humidity limits to which the medication stored in the package may be exposed without losing efficacy. The alarm may be generated from information stored in the package memory (i.e., the allowable humidity limits), or alternatively, by the remote information transceiver based on similar information stored therein. As a result of the alarm, a patient or a medical professional responsible for administering medication to a patient will be immediately informed that the packaged medication should not be used if the package has been subjected to humidity conditions that are outside acceptable limits.

In accordance with a further embodiment, the package includes a light sensor, which is preferably coupled to the computer chip. The light sensor monitors the amount of light to which medications within the blister pack are subjected. A warning may be generated if the cumulative amount of light to which the medication is exposed exceeds a threshold value such that the efficacy of the medication is jeopardized. The warning may be generated based on information stored in the package memory, or, alternatively, by the remote information transceiver based on similar information stored therein. As a result of the alarm, a patient or a medical professional responsible for administering medication to a patient will be immediately informed that the packaged material should not be used if the package has been subjected to a cumulative amount of light that is outside of acceptable limits.

BRIEF DESCRIPTION OF THE DRAWINGS

The features, objects, and advantages of the present invention will become more apparent from the detailed description set forth below when taken in conjunction with the drawings.

DETAILED DESCRIPTION OF THE INVENTION

Figure 1:
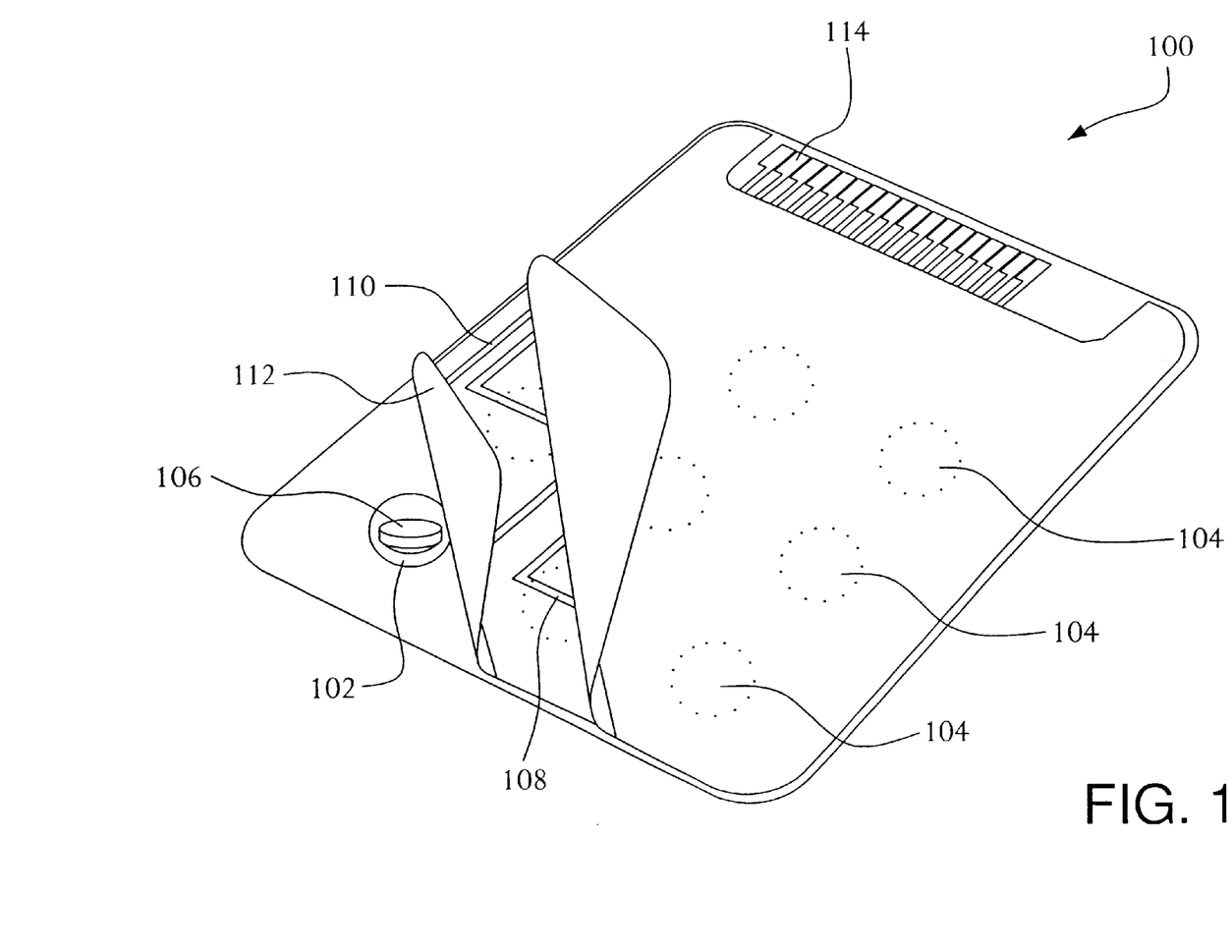
FIG. 1 shows a medication package with severable conductors, with the conductors disposed between a container and a breakable closure layer.

Referring now to FIG. 1, there is shown an illustration of a medication package 100 in accordance with the present invention. Medication package 100 includes a plurality of cells 110 arranged in a grid. Each of the cells 102 is scaled by a breakable closure 104 and holds a unit dose of a medication 106. A user (not shown) gains access to the medication 106 in a given cell 102 by rupturing the breakable closure 104 associated with the given cell 102. The medication package may include, but is not limited to, a single dose of a prescription drug, a single dose of an over-the-counter drug, or a combination of prescription and/or over-the-counter drugs.

A severable conductor 108 is positioned proximate to each cell 102. The severable conductor 108 associated with a given cell 102 is cut when the breakable closure 104 associated with the given cell 102 is ruptured to allow access to the medication 106. The cutting of the severable conductor 108 destroys the ability of the conductor 108 to conduct electricity.

The severable conductors 108 are preferably formed by printing a printed circuit 110 onto an insulating layer 112. The insulating layer 112 is preferably chemically inert to preclude interactions between the insulating layer 112 and medication 106 contained within a cell 102. The severable conductor 108 may be trapped between two insulating layers 112 where the material used for the breakable closure 104 is conductive, such as when a metal foil is used to form the breakable closure 104. The printed circuit 110 may contain traces which connect the severable conductors to edge pads 114, allowing an external device to be electrically connected to the severable conductors 108.

Figure 2:
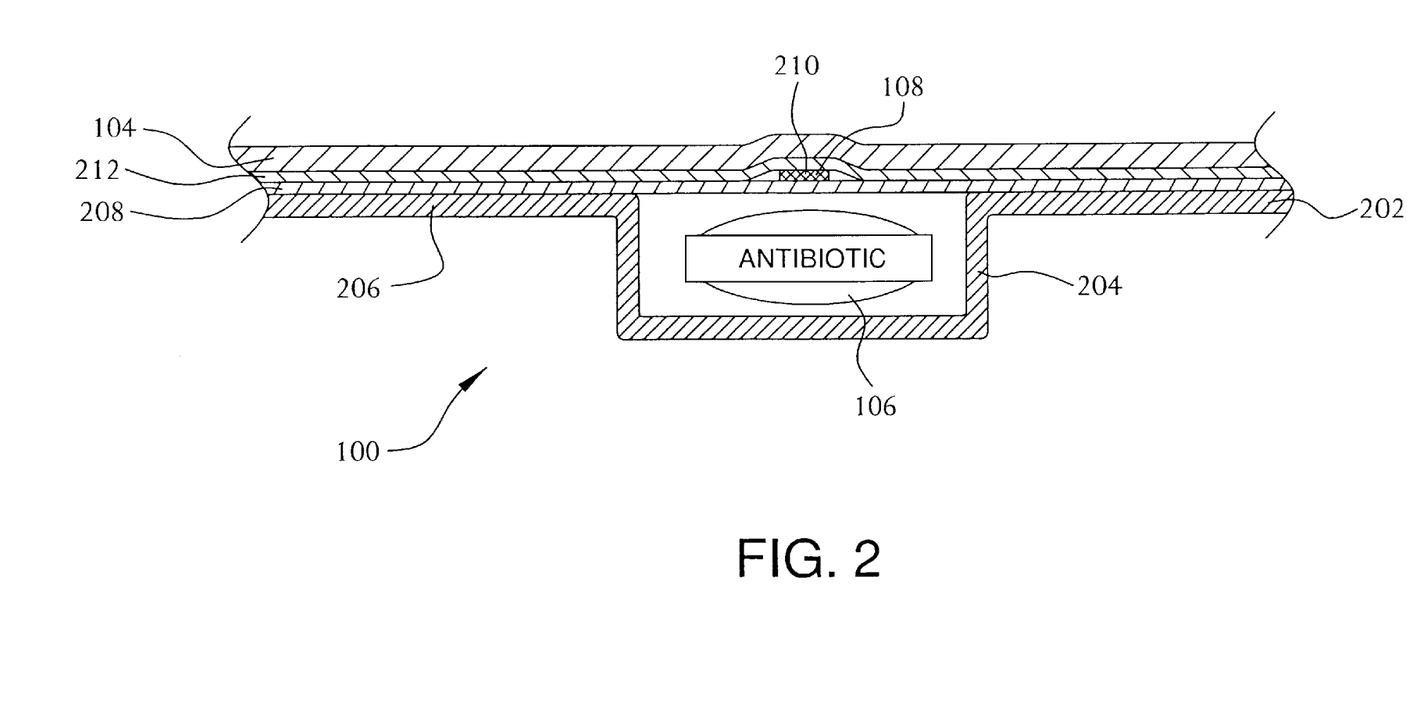
FIG. 2 shows a partial cross-section of a medication package according to the present invention, with a severable conductor formed in an intermediate layer disposed between a container and a breakable closure layer.

A cross-section of a medication package 100 according to the present invention is shown in FIG. 2. A blister card 202 is formed such that pockets 204 extend from a planar card 206. A thin layer of chemically inert dielectric material 208 is adhered to the planar card 206. Traces 210 forming the severable conductor 108 are then printed onto the dielectric layer 208. A second dielectric layer 212 may then be overlayed onto the first dielectric layer 208 and the traces 210. A breakable closure 104 may then be adhered to the second dielectric layer 212. Although the breakable closure 104 preferably extends over the entire top surface of the blister package to protect printed circuitry on the card, the breakable closure may be a plurality of individual closures each covering a cell. The breakable closure 104 is preferably a thin metal foil which tears easily upon application of force to a portion of the metal foil adjacent to a pocket in the blister card. Metal foils have the advantageous properties of being easily ruptured while still providing a barrier to moisture and light entering the cells before the breakable closures are ruptured. Non-conductive materials may also be used to form the breakable closure. If such non-conductive materials are used, the second dielectric layer may be unnecessary.

Figure 3:
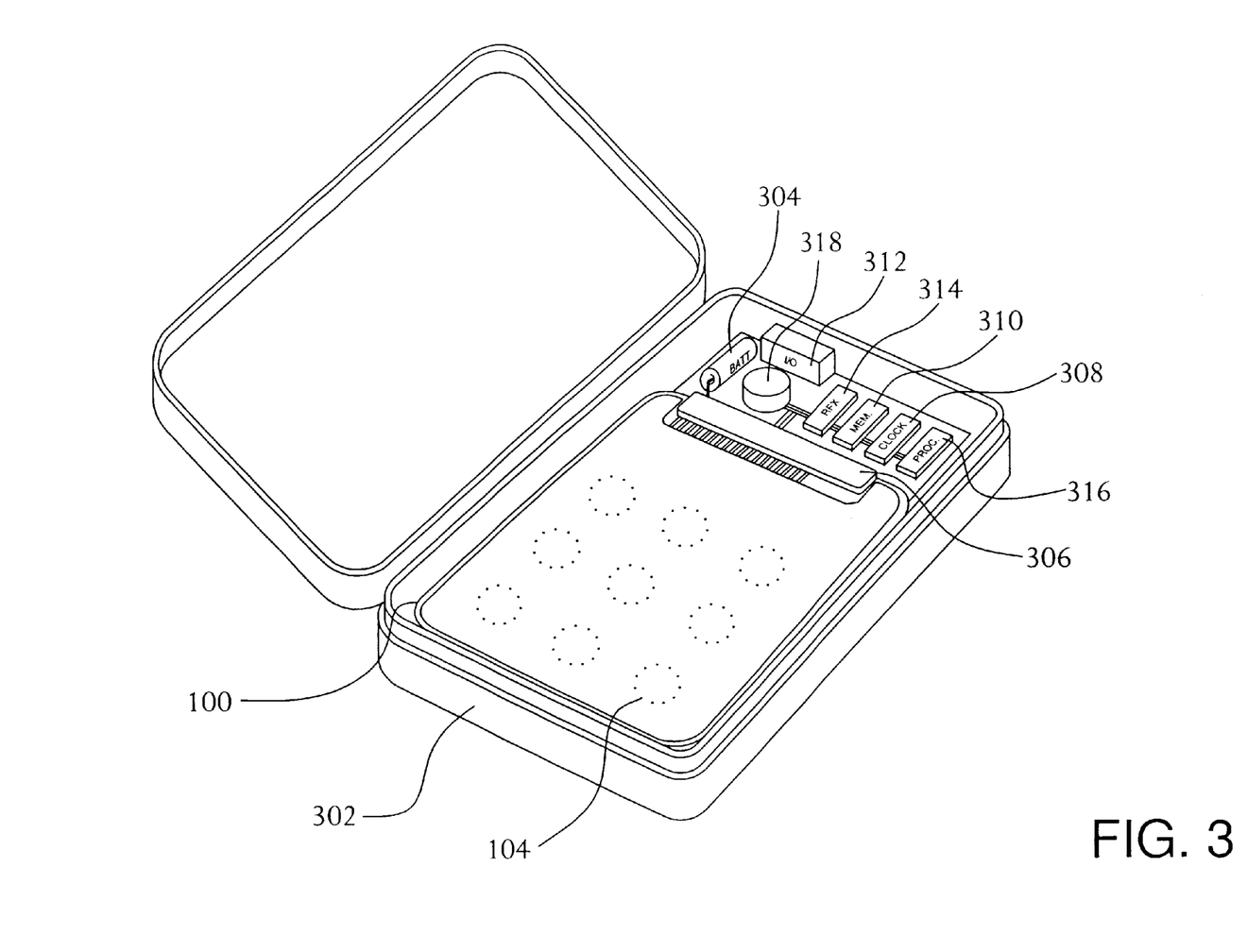
FIG. 3 shows a case for a medical package system including a plurality of severable connectors which are connected to the case, wherein the case further includes a power supply, a processor, a clock, memory for storing information, and an input/output device.

In a simple system utilizing a medication package according to the present invention, a data acquisition device in the form of a case 302 for a medication package as shown in FIG. 3 may be utilized. The case 302 includes a power supply 304, a connector 306 for connecting components within the case to the edge pads 114 of the medication package 100, a clock 308, and memory 310 for storing information regarding when severable conductors 110 associated with specific cells of a medication package 100 have been accessed. The case 302 may further include an input/output capability 312 allowing an external device to read the information stored in memory 310. Alternately, the case may include a RF transceiver 314 for transmitting the information to an external data logging device (not shown). The RF transceiver 314 may also be used to receive information for an alternate embodiment including a processor 316 and a signaling device 318, such as a buzzer or LED light. The signaling device 318 may be used to inform the user of the medication package when it is time to take medication, or when a scheduled time to take medication has passed without the medication being taken.

Figure 4:
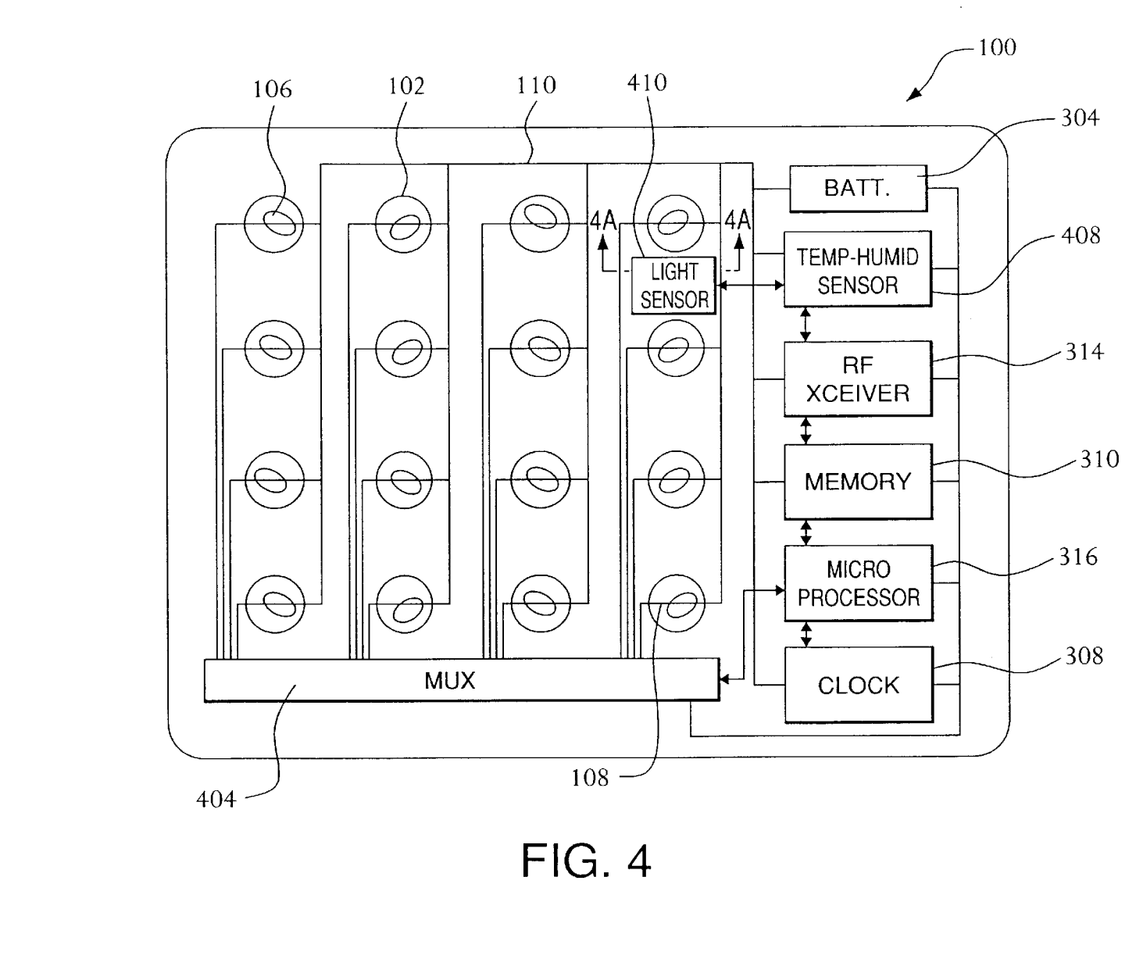
FIG. 4 shows a diagram of a medication package system including a plurality of severable conductors which are multiplexed, and further including a radio frequency transceiver for communicating acquired to an external data device.

In a further embodiment as shown in FIG. 4, a microprocessor 316 is affixed to the blister card 202 and electrically connected to the severable conductors 110. The microprocessor 316 senses the accessing of each cell 102 in the grid by monitoring the output of MUX 404 which, in turn monitors the cutting of each of the severable conductors 108. An RF transceiver 314 may be affixed to the medication package 100 and coupled to the microprocessor 316.

Figure 5:
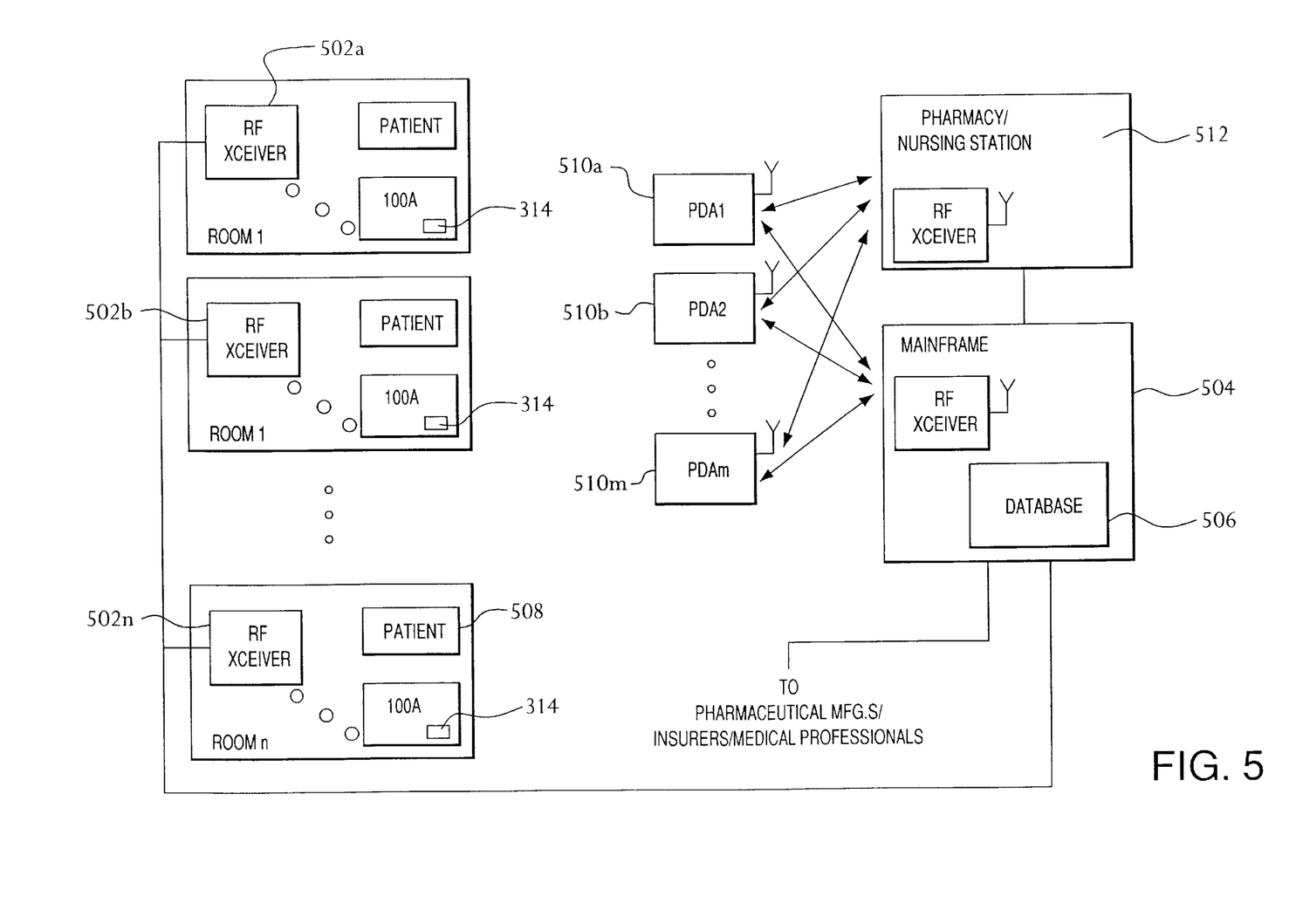
FIG. 5 is a block diagram showing the components of a drug delivery management system which may be used in a hospital environment, in accordance with a preferred embodiment of the present invention.
Figure 6:
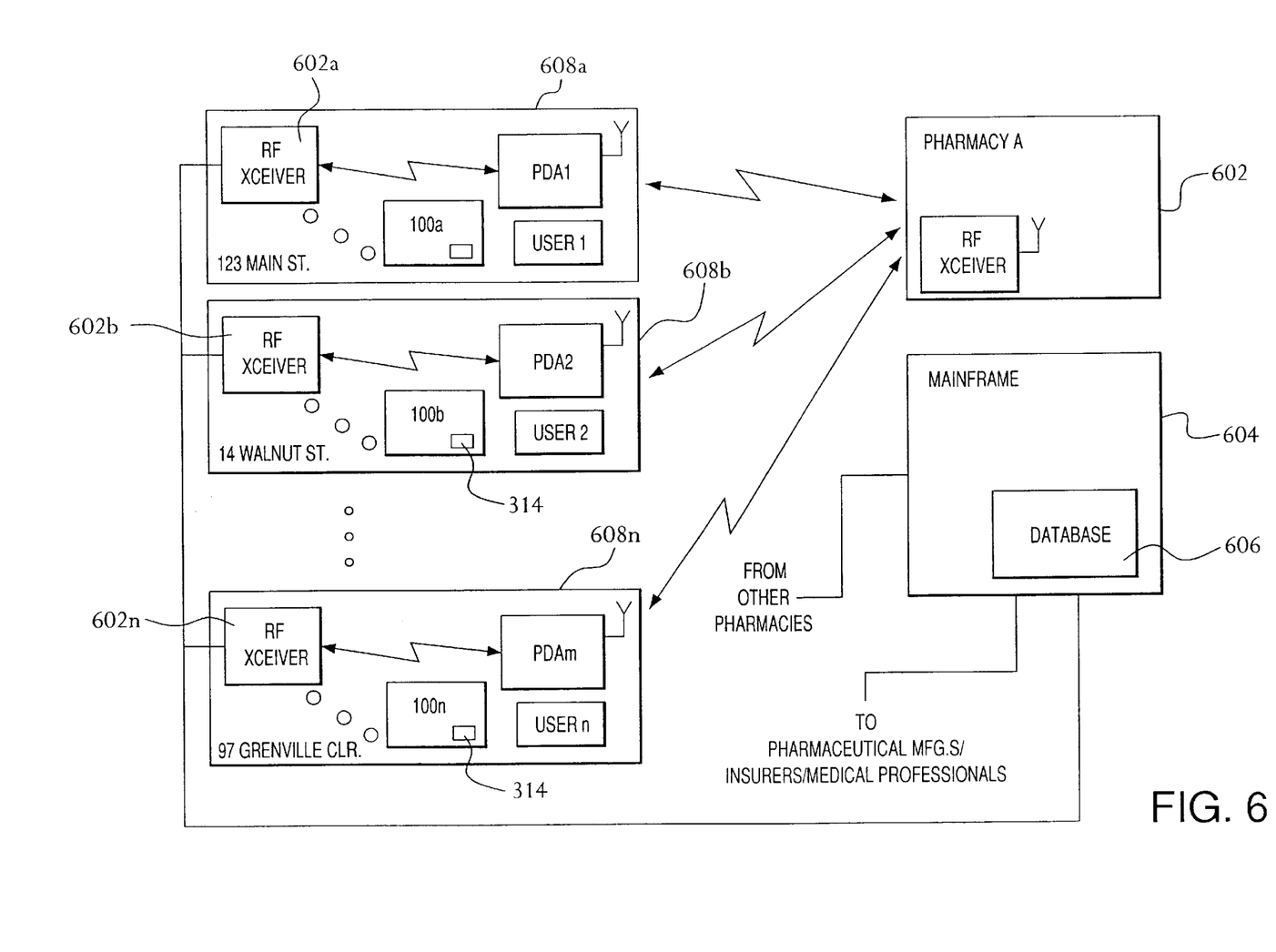
FIG. 6 is a block diagram showing the components of a drug delivery management system which may be used outside of a hospital environment, in accordance with a further preferred embodiment of the present invention.

The RF transceiver 314 may send information corresponding to usage of each of the medications stored in the medication package 100 to a remote information transceiver 502 (e.g., local RF sensors 502a, 502b, . . . and 502n, and central computer frame 504 in FIG. 5 or local RF sensors 602a, 602b, . . . , 602n in FIG. 6).

In an alternate embodiment, the RF transceiver 314 may send information corresponding to usage of medication 106 stored in one cell 102 in the medication package to the remote information transceiver 502 upon cutting of the severable conductor 110 associated with the one cell 102. In addition, the remote information transceiver 502 may be coupled to a database (shown as database 506 in FIGS. 5 and 6) that stores time values. Each of the time values stored in database 506 may represent a time when a medication 106 stored in one cell 102 in the medication package 100 is due to be taken by a patient (such as a patient 508 shown in FIG. 5). Upon receipt of the information corresponding to usage of a medication 106 stored in one cell 102 in the medication package, the remote information transceiver 502 stores a further time value in the database 506 representing a time when medication 106 stored in one cell 102 in the medication package was actually accessed by a patient 508. In a presently preferred embodiment, the remote information transceiver 502 generates an alarm if the time when medication 106 stored in one cell 102 in the blister package is due to be taken by a patient 508 passes before the remote information transceiver 502 receives a signal indicating that the medication 106 stored in the one cell 102 in the medication package was actually accessed by the patient 508.

In this embodiment, RF transceiver 314 also receives information corresponding to an expiration date of each of the medications 100 stored in the medication package 100, and the processor 316 stores such information in memory chip 310. The expiration date information may, for example, be transmitted to and stored in the processor 316 at the time of shipment of the medication package 100 from a manufacturer or distributor. At a later time (e.g., at the time the medication pack 100 is dispensed from a pharmacy), the RF transceiver 314 may send the information corresponding to the expiration date to the remote information transceiver 502. In this embodiment, the remote information transceiver 502 generates a further alarm if the time when medication 106 stored in a cell 102 of the medication package 100 is due to be taken by a patient 508 exceeds the expiration date information associated with the medication package 100.

In this embodiment, RF transceiver 314 also receives information corresponding to the acceptable temperature and humidity limits (e.g., the upper and lower temperature and humidity limits) to which the each of the medications 130 stored in the blister package 110 may be exposed without loss of efficacy, and the computer chip stores such information in memory chip 310. This acceptable temperature/humidity limit information may, for example, be transmitted to and stored in the memory 310 at the time of shipment of the medication package 100 from a manufacturer or distributor. At a later time (e.g., at the time the medication pack 100 is dispensed from a pharmacy), the RF transceiver 314 may send the information corresponding to the acceptable temperature/humidity limits to the remote information transceiver 502. As shown in FIG. 4, medication package 100 may further include a combined temperature/humidity sensor 408 coupled to the processor 316. The temperature/humidity sensor 408 sends information corresponding to the ambient temperature and humidity proximate package 100 to the processor 316.

An alarm is preferably generated in the system if the ambient temperature sensed by the temperature/humidity sensor 408 exceeds a first temperature threshold or is below a second temperature threshold. The first and second temperature thresholds correspond, for example, to the upper and lower temperature limits to which the pharmaceuticals in stored in the package may be exposed without losing efficacy. The alarm may be generated from information stored in memory 310 (i.e., the allowable temperature limits), or alternatively, by the remote information transceiver 502 based on similar information stored therein. As a result of the alarm, a patient or a medical professional responsible for administering medication to a patient will be immediately informed that the packaged medication should not be used if the package has been subjected to temperature conditions that are outside acceptable limits.

Similarly, an alarm is preferably generated in the system if the humidity sensed by the temperature/humidity sensor 408, corresponding to the humidity seen by medication in the package, exceeds a first humidity threshold or is below a second humidity threshold. The first and second humidity thresholds correspond, for example, to the upper and lower humidity limits to which the pharmaceuticals stored in the package may be exposed without losing efficacy. The alarm may be generated from information stored in memory 310 (i.e., the allowable humidity limits), or alternatively, by the remote information transceiver 502 based on similar information stored therein. As a result of the alarm, a patient or a medical professional responsible for administering medication to a patient may be immediately informed that the packaged medication should not be used when the medication has been subjected to humidity conditions that are outside acceptable limits.

In addition to temperature and humidity sensing capabilities, light sensing capabilities may be advantageously included in the package. Light, and especially ultraviolet light, can cause degradation of the efficacy of medication. The shelf life of many medications is based on a worst-case exposure to such light, such that accurate monitoring of the exposure of the medication contained within the packaging may allow accurate estimation of the shelf-life of the medication contained in the blister package.

Figure 4A:
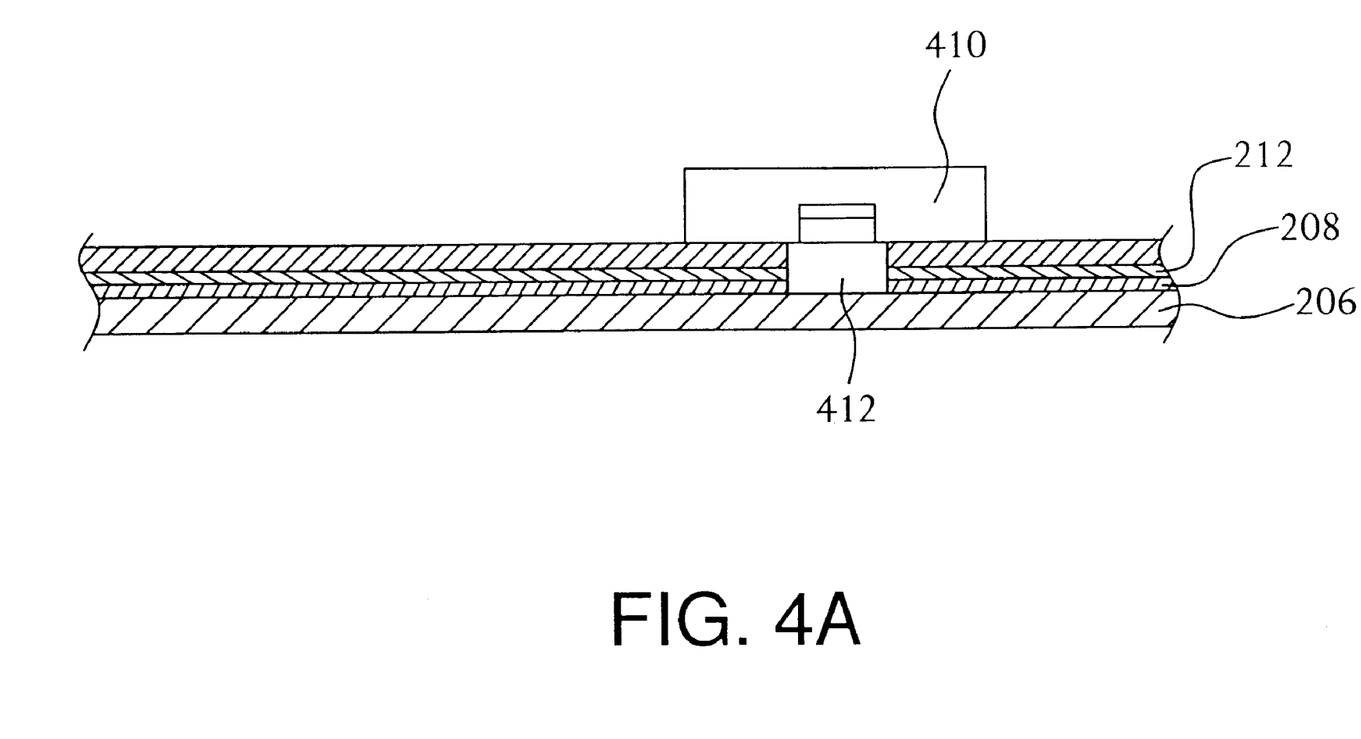
FIG. 4A shows a partial cross-section of a medication package according to the present invention, with a photoelectric sensor integrated with the medication package.

As shown in FIG. 4A, a photo-electric sensor 400, filtered to measure only light which is adverse to the medication contained in the blisterpack, is preferably mounted to the planar surface 206 of the blister card, with the photo-electric sensor exposed to light through the material from which the blister card is formed. If the photo-electric sensor is mounted to the breakable closure 104, an aperture 412 can be cut through the breakable closure 104 and any intervening insulating lays (208, 212). When so installed, the photoelectric sensor is exposed to light levels comparable to those levels to which medication in the in the blister pack is exposed.

By coupling the photo-electric sensor to a computer chip, the total exposure of the medication to light can be determined by summing the light levels over time to which the medication is exposed. A threshold level of how much light the medication can be exposed to without loss of efficacy can be provided to the computer chip, such that an alarm can be sounded when the exposure of the medication to light exceeds exceeds the threshold.

Referring now to FIG. 5, there is shown a block diagram of the components of a drug delivery management system 500, in accordance with a presently preferred embodiment. In this embodiment, the remote information transceiver 502 comprises a plurality of local RF sensors 502*a*, 502*b* . . . 502*n*, each of which is located is an individual hospital room, and a central computer 504 coupled to each of the plurality of local RF sensors. The system also includes a plurality of portable data monitoring units 510*a*, 510*b*, . . . 510*m*, each of which is coupled by a wireless link to the central computer 504 and a pharmacy/nursing station 512. Each of the portable data monitoring units 510*a*, 510*b*, . . . 510*m* is preferably a personal data assistant (PDA), such as a Palm Pilot™ computer, having an integrated wireless modem, and is associated with a medical professional who is responsible for administering medications 106 contained in medication packages 100*a*, 100*b*, . . . 100*n* to a group of one or more patients 508. In this embodiment, each alarm generated by the remote information transceiver 502 is associated with a particular patient 508, and the remote information transceiver sends each such alarm to the portable data monitoring unit 510*a*, 510*b*, . . . 510*m* associated with the medical professional who is responsible for administering medications to the particular patient 508. In addition to receiving such alarms, the portable data monitoring units 510*a*, 510*b*, . . . 510*m* may be used by the medical professionals to send prescription requests directly to the hospital pharmacy 512 via a wireless link, thereby minimizing paperwork and allowing central computer 504 to track the delivery process for a particular patient from the time the prescription is written to the time the medication is actually taken by the patient.

In addition to generating alarms in cases where a specific medication has not been timely delivered, the system of the present invention can monitor all medications being taken by a given patient (at, for example, central computer 504), and generate an alarm if a proposed combination due to be administered to a given patient poses a risk of an unacceptable drug interaction. Furthermore, the medication usage information tracked by the present invention may be transmitted electronically (via central computer 504) to pharmaceutical manufacturers/health maintenance organizations, so that such entities may monitor in real time the usage of drugs by patients.

FIG. 6 is similar to FIG. 5, but shows an implementation of the present invention outside of the hospital environment.

RF transceiving 602, 602*a*, . . . 602*n* can be located in a patients home 608*a*, 608*b*, . . . 608*n* or is a pharmacy 610 to allow information to be exchanged with the medication package 100. A mainframe 604 can be used to accumulate data for pharmaceutical manufacturers, health insurance, medical professionals, and other interested parties regarding the usage of medication.

The previous description of the preferred embodiments is provided to enable any person skilled in the art to make and use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A system for managing delivery of pharmaceutical drugs, comprising:
   (a) a blister package that includes a plurality of cells arranged in a grid, the cells being sealed by a breakable wall and being for holding medication, wherein a user gains access to medication in a given cell by puncturing the breakable wall associated with the given cell;
   (b) a severable conductor positioned proximate to each breakable wall, wherein the severable conductor associated with a given cell is severed upon puncturing of the breakable wall associated with the given cell;
   (c) a processor affixed to the blister package and electrically connected to the severable conductors, wherein the processor senses the puncturing of each cell in the grid by monitoring the rupturing of each of the severable conductors;

(d) an RF transmitter affixed to the blister package and coupled to the computer chip, wherein the RF transmitter sends information corresponding to usage of medication stored in the blister package to a remote information transceiver; and (e) memory affixed to the blister package and coupled to the processor, wherein the RF receiver receives information corresponding to an expiration date of each of the medications stored in the blister package, such information corresponding to the expiration date of each of the medications being stored in the memory;

wherein the RF transmitter sends information corresponding to usage of medication stored in one cell in the blister package to the remote information transceiver upon breakage of the severable conductor associated with the one cell;

wherein the remote information transceiver includes a memory that stores time values, each of the time values representing a time when medication stored in a cell in the blister package is due to be taken by a patient;

wherein, upon receipt of the information corresponding to usage of medication stored in one cell in the blister package, the remote information transceiver stores a further time value representing a time when medication stored in one cell in the blister package was actually accessed; and wherein the remote information transceiver generates an alarm if the time when medication stored in one cell in the blister package is due to be taken by a patient passes before the remote information transceiver receives a signal indicating that the medication stored in the one cell in the blister package was actually accessed.

2. The system of claim 1, wherein the RF transmitter sends the information corresponding to the expiration date to the remote information transceiver.

3. The system of claim 2, wherein the remote information transceiver generates a further alarm if the time when medication stored in one cell in the blister package is due to be taken by a patient exceeds the expiration date information for that medication.

4. The system of claim 3, wherein the RF receiver receives information corresponding to a shipment date of the blister package, such shipment date information being stored in the memory.

5. The system of claim 4, wherein the RF transmitter sends the information corresponding to the shipment date to the remote information transceiver.

6. The system of claim 3, wherein the remote information transceiver comprises a plurality of local RF sensors each of which is located is an individual hospital room, and a central computer coupled to each of the plurality of local RF sensors.

7. The system of claim 6, further comprising a plurality of portable data monitoring units each of which is coupled by a wireless link to the central computer, and wherein each of the portable data monitoring units is associated with a medical professional who is responsible for administering medication to a group of one or more patients.

8. The system of claim 7, wherein each alarm generated by the remote information transceiver is associated with a particular patient, and the remote information transceiver sends each such alarm to the portable data monitoring unit associated with the medical professional who is responsible for administering medications to the particular patient.

9. The system of claim 8, wherein the RF transmitter and the RF receiver are implemented as an integrated RF transceiver.

10. A system for managing delivery of pharmaceutical drugs, comprising:

(a) a blister package that includes a plurality of cells arranged in a grid, the cells being sealed by a breakable wall and being for holding medication, wherein a user gains access to medication in a given cell by puncturing the breakable wall associated with the given cell;

(b) a severable conductor positioned proximate to each breakable wall, wherein the severable conductor associated with a given cell is severed upon puncturing of the breakable wall associated with the given cell;

(c) a processor affixed to the blister package and electrically connected to the severable conductors, wherein the processor senses the puncturing of each cell in the grid by monitoring the rupturing of each of the severable conductors; and (d) an RF transmitter affixed to the blister package and coupled to the computer chip, wherein the RF transmitter sends information corresponding to usage of medication stored in the blister package to a remote information transceiver;

wherein the package further includes a temperature sensor coupled to the processor, and wherein the temperature sensor sends information corresponding to an ambient temperature proximate the package to the processor.

11. The system of claim 10, wherein an alarm is generated if the ambient temperature sensed by the temperature sensor exceeds a first threshold or is below a second threshold.

12. A system for managing delivery of pharmaceutical drugs, comprising:

(a) a blister package that includes a plurality of cells arranged in a grid, the cells being sealed by a breakable wall and being for holding medication, wherein a user gains access to medication in a given cell by puncturing the breakable wall associated with the given cell;

(b) a severable conductor positioned proximate to each breakable wall, wherein the severable conductor associated with a given cell is severed upon puncturing of the breakable wall associated with the given cell;

(c) a processor affixed to the blister package and electrically connected to the severable conductors, wherein the processor senses the puncturing of each cell in the grid by monitoring the rupturing of each of the severable conductors; and (d) an RF transmitter affixed to the blister package and coupled to the computer chip, wherein the RF transmitter sends information corresponding to usage of medication stored in the blister package to a remote information transceiver;

wherein the package further includes a humidity sensor coupled to the processor, and wherein the humidity sensor sends information corresponding to humidity to the processor.

13. The system of claim 12, wherein an alarm is generated if the humidity sensed by the humidity sensor exceeds a first threshold or is below a second threshold.

14. A system for managing delivery of pharmaceutical drugs, comprising:

(a) a blister package that includes a plurality of cells arranged in a grid, the cells being sealed by a breakable wall and being for holding medication, wherein a user gains access to medication in a given cell by puncturing the breakable wall associated with the given cell;

(b) a severable conductor positioned proximate to each breakable wall, wherein the severable conductor associated with a given cell is severed upon puncturing of the breakable wall associated with the given cell;

(c) a processor affixed to the blister package and electrically connected to the severable conductors, wherein the processor senses the puncturing of each cell in the grid by monitoring the rupturing of each of the severable conductors; and (d) an RF transmitter affixed to the blister package and coupled to the computer chip, wherein the RF transmitter sends information corresponding to usage of medication stored in the blister package to a remote information transceiver;

wherein the package further includes a light sensor, the light sensor determining the exposure of medications within the package to light.

15. The system of claim 14, wherein the light sensor is coupled to the processor, and wherein the light sensor sends information corresponding to the exposure of medications within the package to light to the processor.

16. The system of claim 14, wherein the light sensor detects ultraviolet light.

17. The system of claim 16, wherein the ultraviolet light detector is coupled to the processor computer chip, and wherein the light sensor sends information to the processor corresponding to the exposure of medications within the package to ultraviolet light.

* * * * *